United States Patent [19]

Diaz et al.

[11] Patent Number: 4,643,948

[45] Date of Patent: Feb. 17, 1987

[54] COATINGS FOR INK JET NOZZLES

[75] Inventors: Arthur F. Diaz; Richard A. Hernandez, both of San Jose, Calif.

[73] Assignee: International Business Machines Corporation, Armonk, N.Y.

[21] Appl. No.: 714,770

[22] Filed: Mar. 22, 1985

[51] Int. Cl.$^4$ ............................................. B32B 27/00
[52] U.S. Cl. ...................................... 428/422; 427/39; 428/447; 428/450; 428/451; 428/463
[58] Field of Search .................. 427/387, 39; 428/422, 428/447, 450, 451, 463

[56] References Cited

U.S. PATENT DOCUMENTS

| 3,859,320 | 1/1975 | Atherton | 427/387 X |
| 4,091,166 | 5/1978 | Kubacki | 428/411 |
| 4,125,152 | 11/1978 | Kestner et al. | 165/133 |
| 4,226,896 | 10/1980 | Coburn et al. | 427/34 |
| 4,252,848 | 2/1981 | Datta et al. | 428/64 |
| 4,391,843 | 7/1983 | Kaganowicz et al. | 427/41 |

OTHER PUBLICATIONS

Low Surface Energy Fluoro-Epoxy Coating for Drop-On-Demand Nozzles by F. Anger et al, IBM TDB, vol. 26, No. 1, Jun. 1983, p. 431.
Adhesion of Tetrafluorethylene to Substrate by B. D. Washo, IBM TDB, vol. 20, No. 12, May 1978, p. 5233.

*Primary Examiner*—Bernard D. Pianalto
*Attorney, Agent, or Firm*—Joseph G. Walsh

[57] ABSTRACT

An ink jet nozzle plate is coated with a film comprising a partially fluorinated alkyl silane and a perfluorinated alkane.

6 Claims, No Drawings

COATINGS FOR INK JET NOZZLES

TECHNICAL FIELD

The present invention is concerned with coatings for nozzles used in ink jet printing.

BACKGROUND ART

IBM Technical disclosure Bulletin, Volume 26, No. 1, June, 1983, p. 431, shows the use of fluoro-epoxy coating for ink jet nozzles.

IBM Technical Disclosure Bulletin, Volume 20, No. 12, May, 1978, p. 5233, shows the use of an unsaturated silane to promote the adhesion of tetrafluorethylene to a substrate.

U.S. Pat. No. 4,091,166 teaches coating a plastic surface with a plasma of boron trifluoride mixed with an organic monomer.

U.S. Pat. No. 4,125,152 teaches coating a substrate with plasma-polymerized fluroethylene monomer.

U.S. Pat. No. 4,226,896 shows the plasma deposition of a polymer film containing a metal.

U.S. Pat. No. 4,252,848 shows glow discharge deposition of perfluorinated polymers in the presence of a perfluorocycloalkane.

U.S. Pat. No. 4,391,843 shows glow discharge formation of a perfluorinated polymer film in the presence of nitrogen.

DESCRIPTION OF THE INVENTION

In ink jet printing, nozzle plates are used which have silicon surfaces. Wetting of the surfaces by the ink solution causes failure of the ink jet and overall poor printing characteristics. The present invention provides a coating for ink jet nozzle plates which results in clearly improved performance.

According to the present invention, the ink jet nozzle plate is coated with a film which comprises two ingredients. One ingredient is a partially fluorinated alkyl silane and the other ingredient is a perfluorinated alkane. The silane compound and the alkane compound are preferably deposited on the nozzle surface by direct exposure of the surfaces to radio frequency (RF) glow discharge. It is most preferable that the coating have an epitaxial gradation in its chemical composition with the silane decreasing in concentration going away from the nozzle plate and the alkane increasing in concentration going away from the nozzle plate.

In another variation of the present invention, the silane may be deposited as a separate layer next to the nozzle plate and the alkane deposited as a separate layer over the silane layer.

The films deposited according to the present invention are smooth, continuous and featureless. They have excellent adhesion and wear resistant. The films are not removed by the conventional Scotch tape test and do not delaminate when the sample is fractured. Rubbing the samples with a wet, soft sponge for 20,000 passes did not wear away the film, although some roughening of the surface was observed with some films. The films are hydrophobic and have a contact angle with water of 104 degrees and a critical surface energy of 16 ergs per square centimeter. The films are stable to soaking in distilled water and an ink solution at 60° C. There was no evidence of delamination or cracking. The contact angle values (with water) of the films which were soaked in distilled water or black ink were unchanged during 33 days of soaking and reduced to 94 degrees after 54 days at 60° C. The critical surface energy did not change.

PREFERRED EMBODIMENT

A film was prepared in a chamber maintained at 65° C. The jet nozzle surface was directly exposed to RF glow discharge into which was introduced a mixture of argon and trifluoropropylmethyldimethoxysilane. After the initial film growth, perfluoropropane was introduced into the chamber in increasing amounts until the partial pressure of the three gases was about 150 microns. The glow discharge was maintained using an aluminum target and power inputs of 10–20 Watts. The pressure of the argon and the trifluoroproplmethoxysilane was 25 microns each and the perfluoropropane, introduced after the intial film deposition, was about 100 microns.

In a variation of the present invention, instead of perfluoropropane, a polymer from hexafluoroethylene can be used, or a polymer from tetrafluoromethane or perfluorocycloalkane. Alternative silane compounds include perfluoropropoxypropylmethyldichlorosilane and dexamethyldisiloxane.

Jet nozzle plates prepared according to the present invention meet all the criteria for good usage. The films are adherent, wear resistant and have low surface energies. Furthermore, they are stable to water and the ink solutions for long times, such as 1,000 hours at 60° C.

We claim:

1. An ink jet nozzle plate characterized by having a coating of a film which comprises:
    a partially fluorinated alkyl silane and a perfluorinated alkane, with the silane compound being distributed within the coating at a very high concentration in that portion of the coating which touches the plate and at a lower concentration in that portion of the coating away from the plate, and the alkane compound being distributed in the coating at a low concentration in that portion of the coating which touches the plate and at a high concentration in that portion of the coating away from the plate.

2. A nozzle plate as claimed in claim 1 wherein there is an epitaxial gradation in the composition of the film.

3. A nozzle plate as claimed in claim 1 in which the silane compound is present as a separate layer next to the plate, and the alkane compound is present as a separate layer on top of the silane layer.

4. A nozzle plate as claimed in claim 1 wherein the partially fluorinated alkyl silane is trifluoropropylmethyldimethoxysilane.

5. A nozzle plate as claimed in claim 1 wherein the perfluorinated alkane is perfluoropropane.

6. A nozzle plate as claimed in claim 1 wherein the coating has been deposited by radio frequency (RF) glow discharge.

* * * * *